(12) United States Patent
Hamamoto et al.

(10) Patent No.: US 11,664,551 B2
(45) Date of Patent: May 30, 2023

(54) TERMINAL-EQUIPPED CASE MEMBER AND MANUFACTURING METHOD THEREOF

(71) Applicant: OHKITA SEISAKUSYO, Takatsuki (JP)

(72) Inventors: Masaya Hamamoto, Osaka (JP); Yoshifumi Ohkita, Osaka (JP); Takao Saitou, Osaka (JP); Kouji Ohkita, Osaka (JP)

(73) Assignee: OHKITA SEISAKUSYO, Takatsuki (JP)

( * ) Notice: Subject to any disclaimer, the term of this patent is extended or adjusted under 35 U.S.C. 154(b) by 608 days.

(21) Appl. No.: 16/634,729

(22) PCT Filed: Nov. 12, 2019

(86) PCT No.: PCT/JP2019/044311
§ 371 (c)(1),
(2) Date: Jan. 28, 2020

(87) PCT Pub. No.: WO2020/105506
PCT Pub. Date: May 28, 2020

(65) Prior Publication Data
US 2022/0278398 A1 Sep. 1, 2022

(30) Foreign Application Priority Data
Nov. 23, 2018 (JP) .............................. JP2018-219791

(51) Int. Cl.
*H01M 50/133* (2021.01)
*H01M 50/545* (2021.01)
(Continued)

(52) U.S. Cl.
CPC ....... *H01M 50/133* (2021.01); *H01M 50/103* (2021.01); *H01M 50/147* (2021.01);
(Continued)

(58) Field of Classification Search
CPC ............ H01M 50/133; H01M 50/545; H01M 50/193; H05K 5/065
See application file for complete search history.

(56) References Cited

U.S. PATENT DOCUMENTS

| | | | | |
|---|---|---|---|---|
| 5,182,178 A | * | 1/1993 | Brizendine | ......... H01M 50/186 429/185 |
| 2003/0148179 A1 | * | 8/2003 | Uyama | ............... H01M 50/183 429/185 |

(Continued)

FOREIGN PATENT DOCUMENTS

| CN | 102082244 A | 6/2011 |
|---|---|---|
| JP | 2007-242602 A | 9/2007 |

(Continued)

OTHER PUBLICATIONS

May 7, 2021 Supplementary Extended European Search Report issued in European Patent Application No. 19887423.2.

(Continued)

*Primary Examiner* — Michael P McFadden
(74) *Attorney, Agent, or Firm* — Oliff PLC

(57) ABSTRACT

A terminal-equipped case member having an external terminal for electrically connecting an external device, which is fixed to a case body for housing an electronic component or a case member constituting a case lid attached to the case body, includes a base material made of metal that forms the case member; the external terminal inserted into a through hole formed through the base material; a sealing material formed of a first resin material that seals a gap between the external terminal and the base material; and a terminal adhesion layer. The external terminal and the sealing member are bonded to each other through the terminal adhesion layer formed of a second resin material with a higher adhesion to the external terminal than that of the first resin material.

21 Claims, 9 Drawing Sheets

(51) Int. Cl.
*H01M 50/193* (2021.01)
*H05K 5/06* (2006.01)
*H01M 50/147* (2021.01)
*H01M 50/103* (2021.01)
*H01M 50/188* (2021.01)
*H01M 50/197* (2021.01)
*H01M 50/198* (2021.01)
*H01M 50/176* (2021.01)
*H01M 50/562* (2021.01)
*H01M 50/55* (2021.01)
*H01M 50/553* (2021.01)
*H01M 50/588* (2021.01)
*H01M 50/593* (2021.01)

(52) U.S. Cl.
CPC ....... *H01M 50/176* (2021.01); *H01M 50/188* (2021.01); *H01M 50/193* (2021.01); *H01M 50/197* (2021.01); *H01M 50/198* (2021.01); *H01M 50/545* (2021.01); *H01M 50/55* (2021.01); *H01M 50/553* (2021.01); *H01M 50/562* (2021.01); *H01M 50/588* (2021.01); *H01M 50/593* (2021.01); *H05K 5/065* (2013.01)

(56) References Cited

U.S. PATENT DOCUMENTS

| | | | | |
|---|---|---|---|---|
| 2011/0256436 | A1* | 10/2011 | Eo | H01M 50/183 429/94 |
| 2012/0308877 | A1* | 12/2012 | Hirai | H01M 50/166 429/184 |
| 2013/0177803 | A1* | 7/2013 | Kugino | H01M 50/186 429/179 |
| 2017/0005302 | A1* | 1/2017 | Muroi | H01M 50/121 |
| 2017/0047575 | A1* | 2/2017 | Tsuji | H01M 50/572 |
| 2019/0189998 | A1 | 6/2019 | Muroya et al. | |
| 2020/0403194 | A1* | 12/2020 | Amano | B32B 27/325 |

FOREIGN PATENT DOCUMENTS

| | | |
|---|---|---|
| JP | 2007-273392 A | 10/2007 |
| JP | 2010-052365 A | 3/2010 |
| JP | 5492653 B2 | 5/2014 |
| JP | 2017-097978 A | 6/2017 |
| JP | 2018-139190 A | 9/2018 |
| JP | 2019-110030 A | 7/2019 |

OTHER PUBLICATIONS

Dec. 10, 2019 Search Report issued in International Patent Application No. PCT/JP2019/044311.
Dec. 10, 2019 Written Opinion issued in International Patent Application No. PCT/JP2019/044311.
Sep. 3, 2019 Office Action issued in Japanese Patent Application No. 2018-219791.
Apr. 6, 2021 Office Action issued in Chinese Patent Application No. 201980009925.3.

* cited by examiner

FIG. 5
(a)
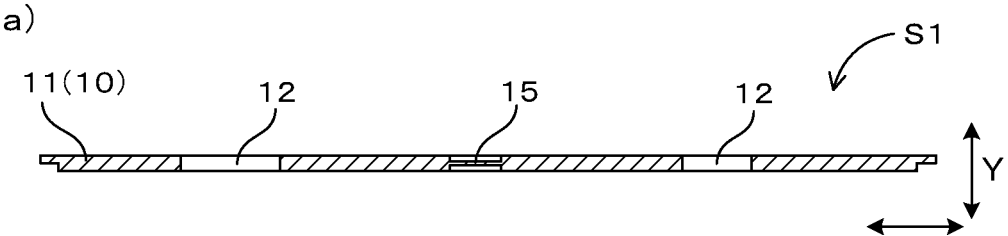
(b)
(c)
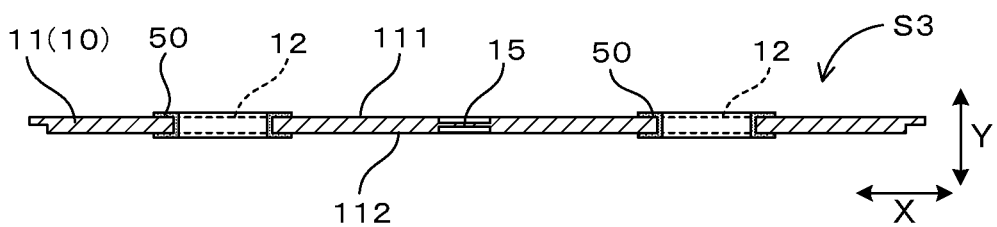
(d)
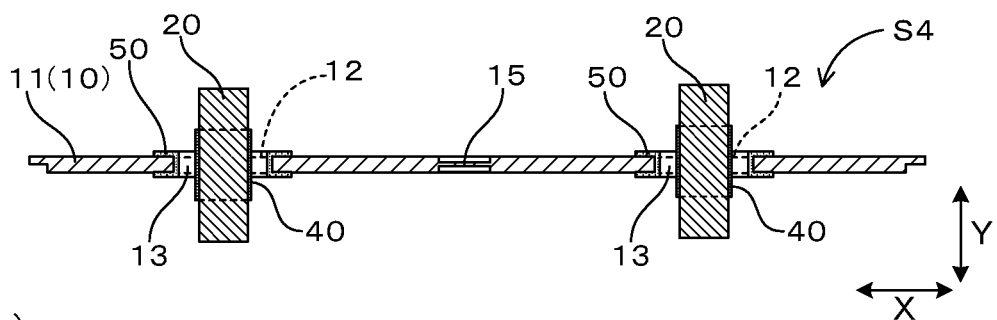
(e)
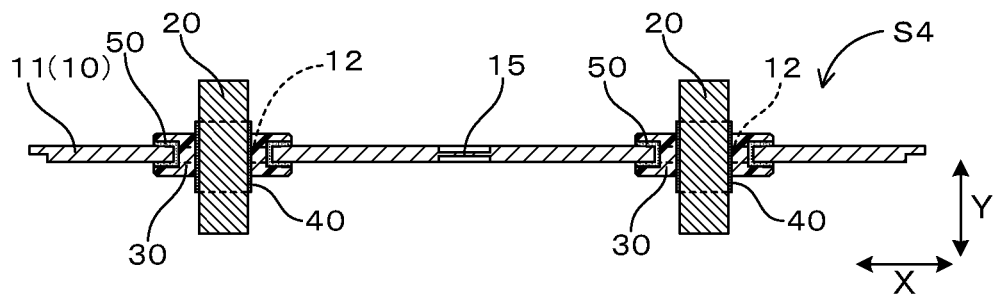

FIG. 7
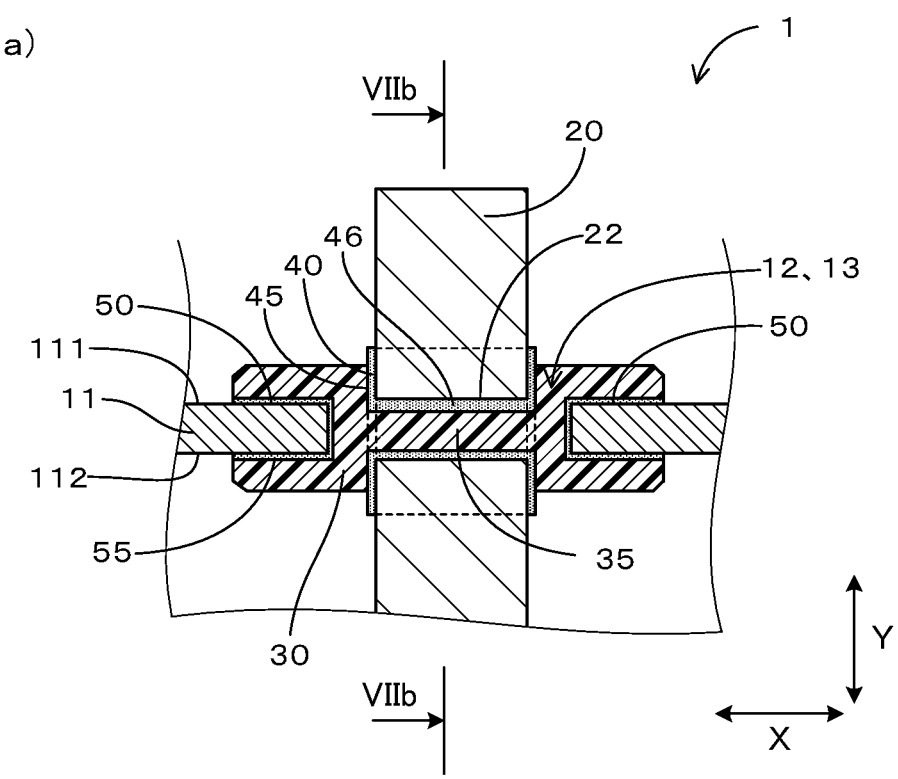
(a)
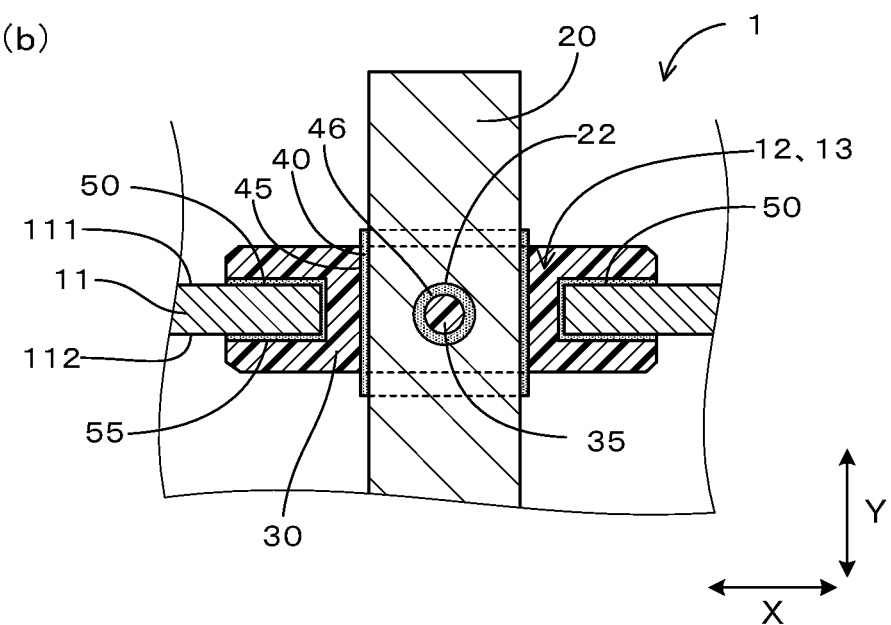
(b)

TERMINAL-EQUIPPED CASE MEMBER AND MANUFACTURING METHOD THEREOF

TECHNICAL FIELD

The present invention relates to a terminal-equipped case member and to a manufacturing method thereof.

BACKGROUND ART

With regard to a capacitor, a lithium-ion battery etc., which contain an electrolyte thereinside, a terminal-equipped case member equipped with an external terminal for electrically connecting an external device has been heretofore used as its case. In order for such a case member to maintain airtightness inside the case, the gap between the external terminal and the case member is sealed with a sealing member made of resin. And where a case member made of metal is used, the sealing member made of resin acquires also insulation between the case member and the external terminal.

Meanwhile, an external terminal is usually made of metal, thus satisfactory adhesion cannot be obtained between the sealing member made of resin and the external terminal made of metal in some cases. In case the adhesion is poor, there is a risk that airtightness between the both will decrease, and airtightness inside the case cannot be maintained accordingly. Therefore, according to a configuration disclosed in Patent Document 1, in the lid of a square case for a lithium-ion battery, the outer surface of an external terminal is notched in a comb-like shape to provide unevenness thereon and allow a sealing member to enter this unevenness, so that the adhesion between the external terminal and the sealing member is enhanced.

PRIOR ART LITERATURE

Patent Document

Patent Document 1
Japanese Patent No. 5492653

SUMMARY OF THE INVENTION

Problem(s) to be Solved by the Invention

Nevertheless, in the configuration disclosed in Patent Document 1, a polyphenylene sulfide resin (PPS), a polybutylene terephthalate resin (PBT), a perfluoroalkoxy resin (PFA), etc. are used as a sealing member, and the resin material constituting the sealing member per se is relatively poor in adhesion to the external terminal made of metal. Therefore, even if unevenness is provided on the external terminal as mentioned above, sufficient airtightness cannot be always expected, and thus there is room for improvement. Alternately, although it may be possible to increase adhesion by forming fine unevenness on the surface of the external terminal to provide surface roughness, sufficient adhesion cannot be necessarily obtained depending on the kind of resin materials for constituting the sealing member. Such tendency becomes remarkable particularly when an engineering plastic or a super engineering plastic is used as a resin material for constituting the sealing member.

The present invention has been made in view of such a background, and it is intended to provide a terminal-equipped case member that is excellent in airtightness.

Means for Solving the Problems

One aspect of the invention is a terminal-equipped case member having an external terminal for electrically connecting an external device, which is fixed to a case body for housing an electronic component or a case member constituting a case lid that is attached to the case body, the terminal-equipped case member including:

a base material made of metal that forms the case member;

the external terminal made of metal that is inserted into a through hole formed through the base material; and a sealing member formed of a first resin material that seals a gap between the external terminal in the through hole and the base material, wherein the external terminal and the sealing member are bonded to each other through a terminal adhesion layer formed of a second resin material with a higher adhesion to the external terminal than that of the first resin material, the first resin material is an engineering plastic or a super engineering plastic, and the second resin material is an epoxy resin, a polyamide-imide resin, or a polyimide resin.

Effects of the Invention

In the above-mentioned terminal-equipped case member, the sealing member and the external terminal are bonded to each other through the terminal adhesion layer, and the second resin material that forms the terminal adhesion layer has a higher adhesion to the external terminal than that of the first resin material. Therefore, in comparison with a case where the terminal adhesion layer is not provided, the adhesion between the external terminal and the sealing member can be increased, so that the airtightness between the external terminal and the base material can be satisfactorily obtained.

As mentioned above, according to the present invention, a terminal-equipped case member that is excellent in airtightness can be provided.

BRIEF DESCRIPTION OF THE DRAWING

FIG. 5 is a schematic view showing a manufacturing method of a terminal-equipped case member, according to Working Example 1.

FIG. 7 is an enlarged cross-sectional view of the neighborhood of an external terminal, according to Modification 2.

MODES FOR CARRYING OUT THE INVENTION

Figure 1:
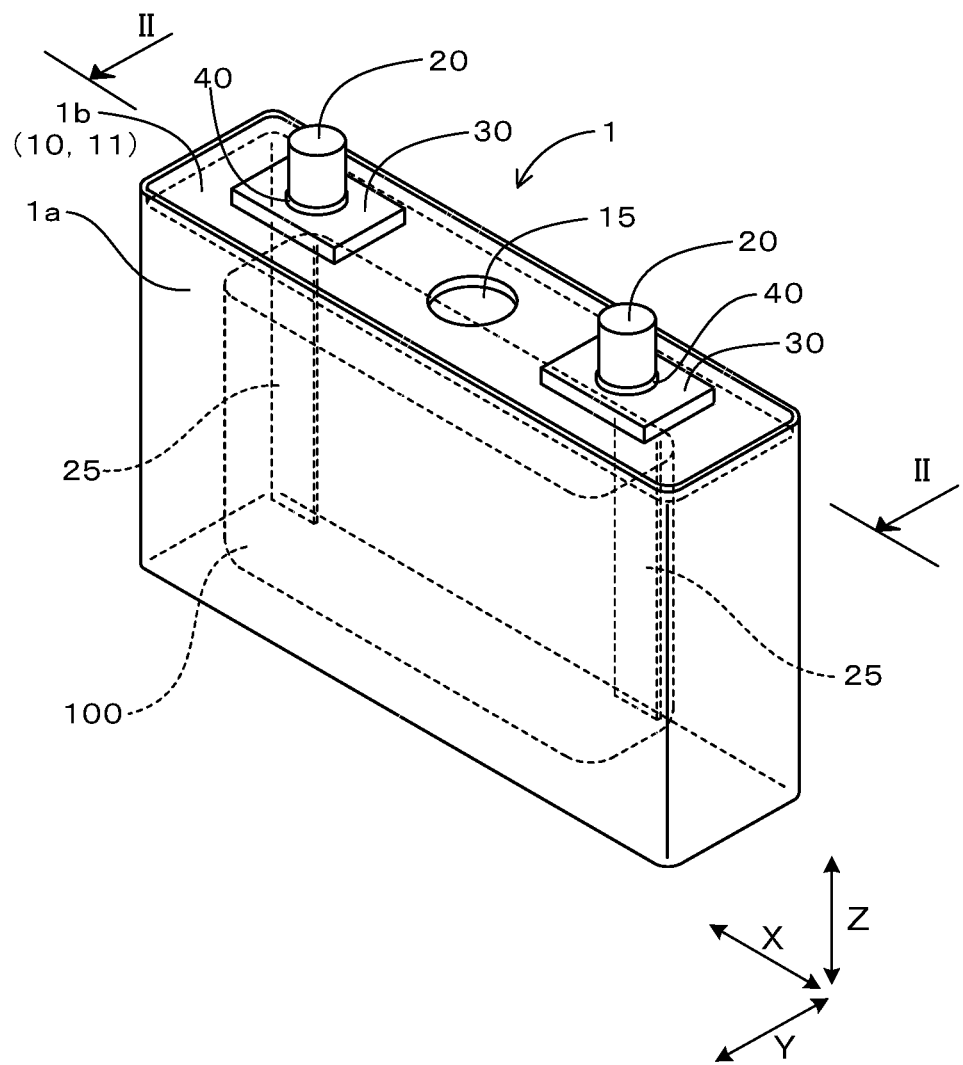
FIG. 1 is a perspective view of an electronic component installed in a terminal-equipped case member, according to Working Example 1.

The above-mentioned first resin material is an engineering plastic or a super engineering plastic, and the above-mentioned second resin material is an epoxy resin, a polyamide-imide resin, or a polyimide resin. By adopting an engineering plastic or a super engineering plastic as the first resin material, the sealing member can be improved in insulation, heat resistance, chemical resistance, and mechanical characteristics. An epoxy resin, a polyamide-imide resin, or a polyimide resin adopted as the second resin material has high wettability with a heat-melted engineering plastic or super engineering plastic, and is well compatible therewith, thus it has high affinity and compatibility as surface characteristics with respect to the engineering plastic or the super engineering plastic. In addition, because these materials are excellent in heat resistance, heat deterioration due to a heat-melted engineering plastic or super engineering plastic at the time of molding tends not to occur. Therefore, by adopting the first resin material and the second resin material as described above, satisfactory adhesion can be obtained between the terminal adhesion layer and the external terminal made of metal, and between the sealing member and the terminal adhesion layer. Further, because the sealing member and the terminal adhesion layer are both made of resin, satisfactory adhesion can be obtained therebetween. Consequently, the airtightness between the external terminal and the base material can be further improved.

It is noted that in the present specification, an engineering plastics means a resin material that has a heat-resistant temperature of 100° C. or higher, and is more excellent in tensile strength and elastic modulus than those of a general purpose plastic. In addition, a super engineering plastic means a resin material having a heat-resistant temperature of 150° C. or higher among engineering plastics.

The above-mentioned terminal adhesion layer is preferably composed of an electrodeposition coating film. Electrodeposition is a technique for forming a thin polymer film firmly on the surface of an object to be coated, in which the object to be coated of a conductor is immersed in a bath filled with a water-soluble paint for electrodeposition so as to form a water-insoluble coating uniformly on the surface thereof by applying a voltage between the object to be coated and an counter electrode to flow a current, and is subjected to baking and drying. As long as an object to be coated is made of a conductor such as a metal, electrodeposition makes it possible to form a uniform resin thin film on the surface of the object even in the case of a complicated shape. Accordingly, forming the terminal adhesion layer with an electrodeposition coating film allows the terminal adhesion layer to have a uniform film thickness even if an external terminal has a complicated shape. In addition, because the terminal adhesion layer can be formed of a firm resin coating, it will be excellent in heat resistance. As a result, heat deterioration in the terminal adhesion layer due to melting heat at the time of molding the sealing member can be curtailed to thereby achieve further excellent airtightness.

The thickness of the terminal adhesion layer is preferably within a range of 10-80 μm. In this case, the terminal adhesion layer can have sufficient adhesion to both the external terminal and the sealing member, so that the airtightness between the external terminal and the base material can be further improved.

It is preferable that the external terminal has a recess or a through hole formed on an outer peripheral surface thereof, part of the terminal adhesion layer penetrates the recess or the through hole, and part of the sealing member is bonded to the part of the terminal adhesion layer that has penetrated the recess or the through hole. In this case, the adhesion of the terminal adhesion layer with respect to the external terminal is improved, so that the airtightness between the external terminal and the base material is further improved.

Between the base material and the sealing member, there lies a base material adhesion layer formed of a third resin material with a higher adhesion to the base material than that of the first resin material. In this case, the airtightness between the sealing member and the base material is improved having the base material adhesion layer interposed therebetween.

Another aspect of the present invention is a method for manufacturing a terminal-equipped case member, the method including:

a preparation step of preparing the base material having the through hole;

a terminal adhesion layer formation step of forming the terminal adhesion layer on the external terminal; and a sealing step of sealing the gap by filling the gap between the external terminal in the through hole and the base material with the first resin material in a state that the external terminal is inserted into the through hole to form the sealing member so that the external terminal and the sealing member are bonded to each other through the terminal adhesion layer.

According to such a manufacturing method, a terminal-equipped case member that is excellent in airtightness can be manufactured, as described above.

In the terminal adhesion layer formation step, the terminal adhesion layer is preferably formed on the external terminal by electrodeposition. In this case, the terminal adhesion layer can be formed as a firm thin film by electrodeposition, which tends not to suffer heat deterioration, so that a terminal-equipped case member that is excellent in airtightness can be manufactured. In addition, because such a molding material for the terminal adhesion layer is excellent in throwing power, occurrence of an uncoated part in the area intended to form a terminal adhesion layer can be prevented, and dropping of the molding material hardly occurs, so that a uniform resin coating can be formed. Therefore, control of forming the terminal adhesion layer becomes easy.

In the sealing step, the sealing member may be formed by filling the gap between the external terminal in the through hole and the base material with the first resin material of an engineering plastic or a super engineering plastic by insert molding. In the past, when insert-molding a metal and an engineering plastic, forming a resin layer on the surface of the metal in advance as an adhesion layer for bonding the both, i.e. application of a so-called primer or a basecoat was rarely performed. However, the first resin material of an engineering plastic or a super engineering plastic can be filled in the gap to form the sealing member by insert molding as described above by forming the terminal adhesion layer by electrodeposition in a firm thin film that tends not to suffer heat deterioration. As a result, the gap can be surely sealed with the sealing member, so that a terminal-equipped case member that is further excellent in airtightness can be manufactured.

In the terminal adhesion layer formation step, it is preferable that the second resin material of a thermosetting epoxy resin, a polyamide-imide resin, or a polyimide resin is applied to the external terminal by electrodeposition, and is dried in a temperature environment below the curing temperature of the second resin material to thereby form the terminal adhesion layer in a semi-cured state, and in the sealing step, the external terminal is inserted into the through hole to be located inside the through hole such that the terminal adhesion layer thus semi-cured is located inside the through hole, the first resin material of a heat-melted engineering plastic is filled into the gap to cause compatibilization with part of the second resin material, and is heated to the curing temperature of the second resin material or more to thereby completely cure the terminal adhesion layer. In this case, the terminal adhesion layer and the sealing member can be made into a state of being firmly stuck together, so that the airtightness between the base material and the external terminal can be further improved. In addition, between the terminal adhesion layer and the sealing member, a terminal side compatible layer in which both resin materials are compatible with each other is formed. The terminal side compatible layer makes it possible to reduce a stress caused by thermal expansion and contraction difference between the external terminal made of metal and the sealing member formed of resin, so that reduction of the airtightness that will be accompanied with temperature change can be restrained.

WORKING EXAMPLES

Working Example 1

A working example of the above-mentioned terminal-equipped case member is explained below with reference to FIGS. 1 to 5.

As shown in FIG. 1, a terminal-equipped case member 1 of Working Example 1 is configured to have external terminals 20 for electrically connecting an external device, which is fixed to a case body 1a for housing an electronic component 100 or a case member 10 constituting a case lid 1b that is attached to the case body 1a.

Figure 2:
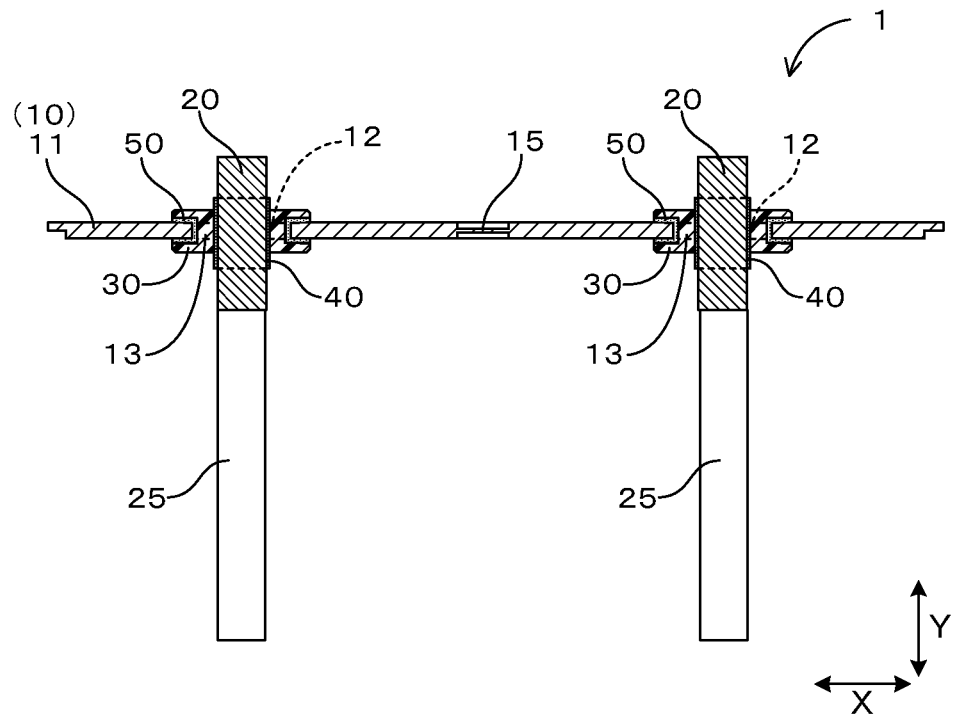
FIG. 2 is a cross-sectional view of the terminal-equipped case member taken along II-II line in FIG. 1.

The terminal-equipped case member 1 includes a base material 11, external terminals 20, and sealing members 30 as shown in FIG. 2.

The base material 11 is made of metal, and constitutes the case member 10.

Each external terminal 20 is inserted into a through hole 12 formed through the base material 11.

Each sealing member 30 is formed of a first resin material, and seals a gap 13 between the external terminal 20 in the through hole 12 and the base material 11.

The external terminal 20 and the sealing member 30 are bonded to each other through a terminal adhesion layer 40 formed of a second resin material with a higher adhesion to the external terminal 20 than that of the first resin material.

Hereinafter, the terminal-equipped case member 1 of Working Example 1 is explained in detail.

As shown in FIG. 1, the case body 1a houses an electronic component 100, and the case lid 1b is attached to the opening of the case body 1a. In the present example, the case lid 1b serves as the case member 10, to which the after-mentioned external terminal 20 is attached. In the present example, the electronic component 100 is an electrode body, and an electrolyte is filled inside the case in a state that the opening of the case body 1a is sealed with the case lid 1b to thereby constitute a secondary battery.

As shown in FIG. 2, the base material 11 made of metal, which forms the case member 10, is provided with two through holes 12 and a relief valve 15. In the present example, the base material 11 is made of an aluminum alloy. And, each through holes 12 has the external terminal 20 inserted therethrough. The external terminals 20 are made of metal, which may be copper, aluminum alloys, etc., and copper is used in the present example. In addition, the external terminals 20 in the present example are formed in a cylindrical shape. The bottom of each external terminal 20, which is positioned inside the case body 1a, has a collector 25 welded thereto to be connected to the electronic component 100.

Figure 3:
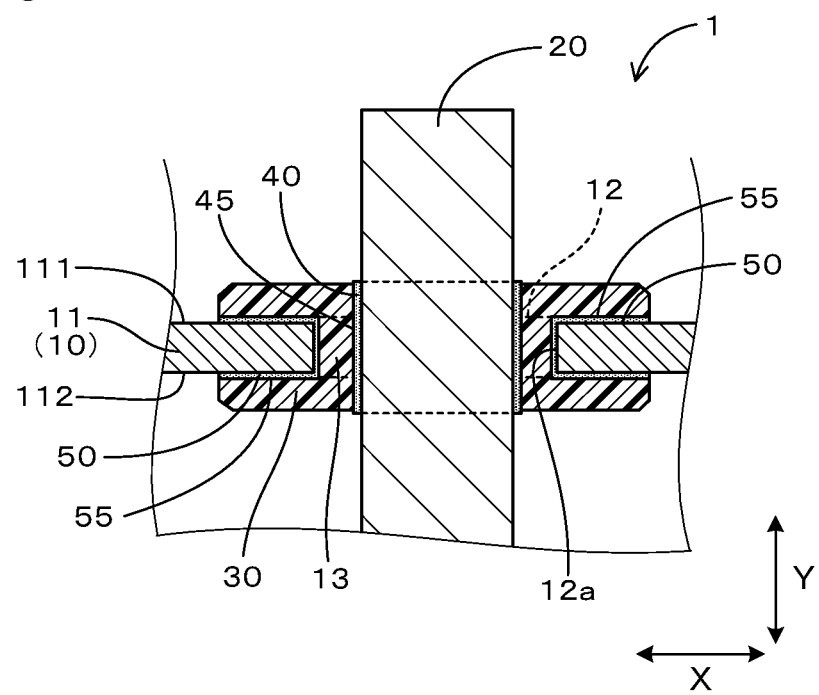
FIG. 3 is an enlarged cross-sectional view of the neighborhood of an external terminal in FIG. 2.

As shown in FIG. 3, the terminal adhesion layer 40 is provided at the central area of the outer surface of the external terminal 20 in its axial direction Y, the area including a portion positioned inside the through hole 12. The terminal adhesion layer 40 is a resin coating that is formed by electrodeposition. With regard to a resin material for forming the terminal adhesion layer 40 (the second resin material), a resin material with a higher adhesion to the external terminal 20 than that of the first resin material that forms the after-mentioned sealing member 30 is used. For example, as the resin material for forming the terminal adhesion layer 40 (the second resin material), a thermosetting epoxy resin as a cationic electrodeposition coating material, a polyamide-imide resin, or a polyimide resin may be used, and in the present example, the thermosetting epoxy resin is used. An average thickness of the terminal adhesion layer 40 may be set within a range of 10-80 μm, preferably set within a range of 20-50 μm, and is set to 30 μm in the present example. If the average thickness of the terminal adhesion layer 40 is less than 10 μm, fine unevenness on the terminal surface causes uneven coating such that the terminal adhesion layer 40 is made too thin, and/or an uncoated part by which the terminal adhesion layer 40 is not formed, which is not favorable. On the other hand, if the average thickness of the terminal adhesion layer 40 exceeds 80 μm, there is a risk that it may take excessively much time to form the layer, therefore it is considered to be distant.

In the present example, as shown in FIG. 3, a base material adhesion layer 50 is formed on an area that extends over a wall surface 12a of the through hole 12 in the base material 11, a certain area on an upper side surface 111 of the base material 11 near the through hole 12, and a certain area on a back side surface 112 of the base material 11 near the through hole 12. In the present example, the base material adhesion layer 50 is a resin coating formed by electrodeposition as with the terminal adhesion layer 40, and has the same configuration as the terminal adhesion layer 40.

As shown in FIG. 3, in the through hole 12, the gap 13 between the base material 11 and the external terminal 20 is sealed with the sealing member 30. And the terminal adhesion layer 40 lies between the external terminal 20 and the sealing material 30, whereby the external terminal 20 and the sealing member 30 are bonded to each other through the terminal adhesion layer 40. In addition, the base material adhesion layer 50 lies between the base material 11 and the sealing member 30, whereby the base material 11 and the sealing member 30 are bonded to each other.

As a resin material for forming the sealing member 30 (the first resin material), a thermoplastic resin material is preferable in order that the after-mentioned insert molding can be performed, and preferably has a heat-resistant temperature of 150° C. or higher in consideration of the circumference of being exposed to high temperature during the insert molding. In addition, from the viewpoint of ensuring the compatibility and adhesiveness between the first resin material and the second resin material, the solubility parameters (SP values) of the both are preferably set to be close to each other. For example, in view of the case where an epoxy resin having an SP value of around 11, a polyamide-imide resin or a polyimide resin having an SP value of around 13.6 is used as the second resin material, a resin material having a solubility parameter (SP value) within a range of 9.5-15 may be used as the first resin material.

For example, as the first resin material, engineering plastics such as a nylon resin, a polycarbonate resin, etc., and super engineering plastics such as a polyphenylene sulfide (PPS) resin, a polysulfone (PSF) resin, a polyether sulphone (PES) resin, a polyamide-imide (PAI) resin, etc. may be used, and a PPS resin is used in the present example.

Figure 4:
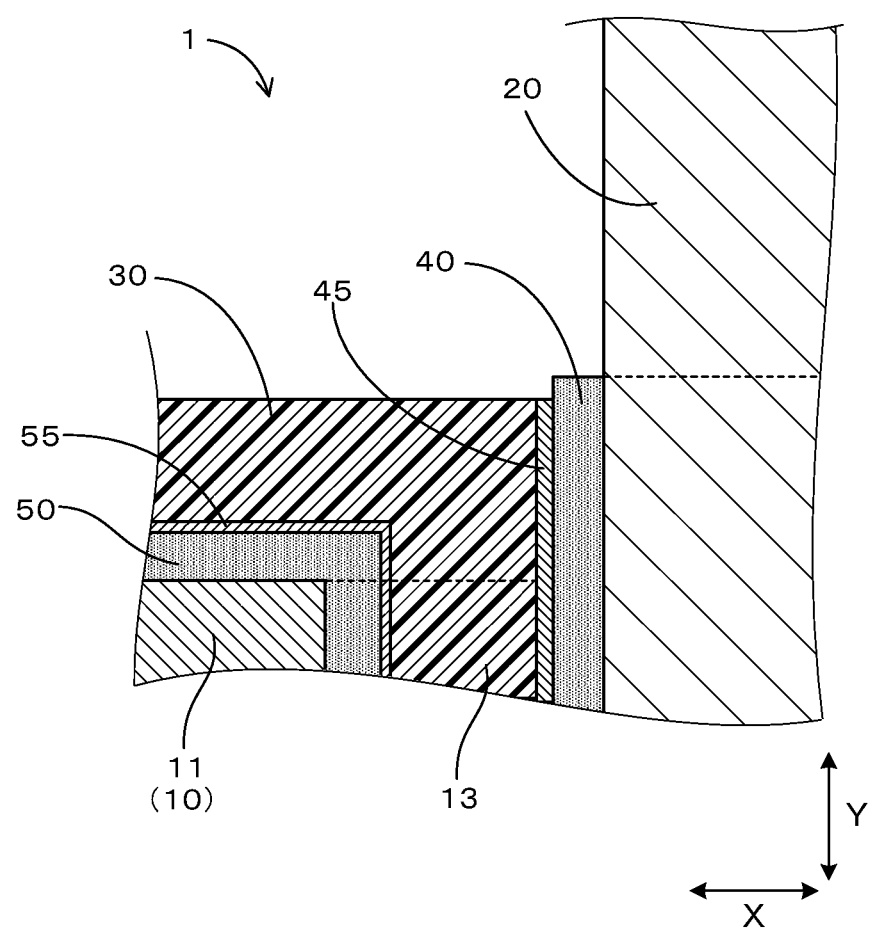
FIG. 4 is a further enlarged cross-sectional view of the neighborhood of the external terminal in FIG. 3.

In the present example, as shown in FIG. 4, between the terminal adhesion layer 40 and the sealing member 30, a terminal side compatible layer 45 in which both the resin materials are compatible with each other is formed. In addition, between the base material adhesion layer 50 and the sealing member 30, a base material side compatible layer 55 in which both the resin materials are compatible with each other is formed. It is noted that the boundaries between the terminal side compatible layer 45 and the sealing member 30, and between the terminal side compatible layer 45 and the terminal adhesion layer 40 are actually unclear. Similarly, the boundaries between the base material side compatible layer 55 and the sealing member 30, and between the base material side compatible layer 55 and the base material adhesion layer 50 are also actually unclear.

Hereinafter, a manufacturing method of the terminal-equipped case member 1 of the present example is explained.

First, a preparation step S1 shown in FIG. 5 (*a*) is performed. In the preparation step S1, the base material 11 having the through holes 12 are prepared. The through holes 12 are formed so as to have a larger diameter than that of the external terminal 20 so that the external terminal 20 can be loosely inserted.

Next, a terminal adhesion layer formation step S2 shown in FIG. 5 (*b*) is performed. In the terminal adhesion layer formation step S2, the terminal adhesion layer 40 is formed on the external terminal 20. In the terminal adhesion layer formation step S2 of the present example, a resin coating composed of a water-solubilized thermosetting epoxy resin is formed by electrodeposition to thereby form the terminal adhesion layer 40. It is noted that in order to form the terminal adhesion layer 40 on the external terminal 20 in the area located inside the through hole 12, and its neighboring area, electrodeposition is performed masking both end regions other than these areas. According to the present example, in the terminal adhesion layer formation step S2, a thermosetting epoxy resin is applied to the external terminal 20 by electrodeposition, and is dried in a temperature environment below the curing temperature of the epoxy resin to thereby form the terminal adhesion layer 40 in a semi-cured state.

The electrodeposition in the terminal adhesion layer formation step S2 according to the present example is performed in the following manner. First, washing and degreasing are performed on the surface of the external terminal 20. Thereafter, the external terminal 20 that has been subjected to the washing and degreasing is immersed in a bath for electrodeposition in which a cation type epoxy resin electrodeposition coating material (manufactured by NIPPON-PAINT Co., Ltd., Model number: INSULEED3030) with a solid concentration of 20% is filled, and is energized with an applied voltage of 200V for three minutes. Then, the external terminal 20 is taken out from the bath, washed with water, and dried in a drying furnace of 130° C. for 20 minutes. In this way, the terminal adhesion layer 40, which is composed of an epoxy resin coating in a semi-cured state with an average thickness of 50 can be formed.

Furthermore, in the present example, a base material adhesion layer formation step S3 shown in FIG. 5 (*c*) is performed. In the base material adhesion layer formation step S3, the base material adhesion layer 50 is formed on the wall surface of the through hole 12 in the base material 11, an upper side surface 111 of the base material 11 in the area adjacent to the through hole 12, and a back side surface 112 of the base material 11 in the area adjacent to the through hole 12. The base material adhesion layer formation step S3 is performed by electrodeposition as with the terminal adhesion layer formation step S2.

Thereafter, a sealing step S4 shown in FIG. 5(*d*) and FIG. 5(*e*) is performed. In the sealing step S4, the gap 13 between the external terminal 20 in the through hole 12 and the base material 11 is sealed with the sealing member 30 composed of a PPS resin as shown in FIG. 5(*e*) in a state that the external terminal 20 is inserted into the through hole 12 as shown in FIG. 5(*d*). The sealing member 30 is formed by insert molding. In the present example, the external terminal 20 provided with the terminal adhesion layer 40 composed of an epoxy resin coating in a semi-cured state is placed in a mold for insert molding not illustrated in a state of being inserted into the through hole 12 of the base material 11, then a PPS resin that has been melted by heating to 330° C. is poured into the insert molding mold and filled in the gap 13 as shown in FIG. 5(*e*) to thereby seal the gap 13 and form the sealing member 30. Thus, due to the configuration in which the terminal adhesion layer 40 lies between the sealing member 30 and the external terminal 20, the sealing member 30 and the external terminal 20 are bonded to each other through the terminal adhesion layer 40, and due to the configuration in which the base material adhesion layer 50 lies between the sealing member 30 and the base material 11, the sealing member 30 and the base material 11 are bonded to each other through the base material adhesion layer 50. Thereafter, the collector 25 is welded to the external terminal 20 to form the terminal-equipped case member 1 shown in FIG. 2.

In the present example, by the above-mentioned insert molding, between the terminal adhesion layer 40 and the sealing member 30 shown in FIG. 4, the terminal side compatible layer 45 in which both molding materials are compatible with each other is formed, and between the base material adhesion layer 50 and the sealing member 30, the base material side compatible layer 55 in which both molding materials are compatible with each other is formed.

Next, operational effects in the terminal-equipped case member 1 of the present example are explained in detail.

According to the terminal-equipped case member 1 of the present example, the external terminal 20 and the sealing member 30 are bonded to each other through the terminal adhesion layer 40, and the second resin material that forms the terminal adhesion layer 40 has a higher adhesion to the external terminal 20 than that of the first resin material that forms the sealing member 30. Therefore, in comparison with the case that the terminal adhesion layer 40 is not provided, adhesion between the external terminal 20 and the sealing member 30 can be increased, so that airtightness between the external terminal 20 and the base material 11 can be satisfactorily ensured.

Furthermore, in the present example, an engineering plastic is used as the first resin material that is a molding material for the sealing member 30, and an epoxy resin is used as the second resin material that is a molding material for the terminal adhesion layer 40. In this way, by adopting an engineering plastic or a super engineering plastic as the first resin material, the sealing member 30 can be improved in insulation, heat resistance, chemical resistance, and mechanical characteristics. An epoxy resin, a polyamide-imide resin, or a polyimide resin adopted as the second resin material has high wettability with a heat-melted engineering plastic or super engineering plastic, and is well compatible with each other, thus it has high affinity and compatibility with respect to the engineering plastic or the super engineering plastic as surface characteristics. In addition, because these materials are excellent in heat resistance, heat deterioration due to the heat-melted engineering plastic or super engineering plastic tends not to occur during molding. Therefore, by adopting the first resin material and the second resin material as described above, satisfactory adhesion can be obtained between the terminal adhesion layer 40 and the external terminal 20 made of metal, and between the sealing member 30 and the terminal adhesion layer 40. Further, because the sealing member 30 and the terminal adhesion layer 40 are both made of resin, satisfactory adhesion can be obtained therebetween. Consequently, the airtightness between the external terminal 20 and the base material 11 can be further improved.

Furthermore, in the present example, the terminal adhesion layer 40 is composed of an electrodeposition coating film. Therefore, even if the external terminal 20 might have a complicated shape, the terminal adhesion layer 40 can be made to have a uniform film thickness. In addition, the terminal adhesion layer 40 can be formed of a firm resin coating so as to be excellent in heat resistance. As a result, heat deterioration in the terminal adhesion layer 40 caused by melting heat at the time of molding the sealing member 30 can be restrained to thereby achieve further excellent airtightness. In particular, when a super engineering plastic is used as the first resin material that is a molding material for the sealing member 30, because the super engineering plastic has high heat resistance of 150° C. or higher, heat deterioration caused by melting heat of the super engineering plastic can be effectively restrained by forming the terminal adhesion layer 40 with an electrodeposition coating film that is excellent in heat resistance.

Furthermore, in the present example, the thickness of the terminal adhesion layer 40 is set to 30 μm within a range of 10-80 μm. As a result, the terminal adhesion layer 40 can possess sufficient adhesion with respect to both the external terminal 20 and the sealing member 30, so that airtightness between the external terminal 20 and the base material 11 can be further increased.

Furthermore, in the present example, the base material 11 and the sealing member 30 are bonded to each other through the base material adhesion layer 50 that is formed of the third resin material having a higher adhesion to the external terminal 20 than that of the first resin material. As a result, airtightness between the sealing member 30 and the base material 11 is increased through the base material adhesion layer 50. It is noted that in the present example, the third resin material that forms the base material adhesion layer 50 is the same as the molding material (the second resin material) for the terminal adhesion layer 40. Further, in the present example, between the base material adhesion layer 50 and the sealing member 30, the base material side compatible layer 55 in which both resin materials are compatible with each other is formed. The base material side compatible layer 55 makes it possible to reduce a stress caused by thermal expansion and contraction difference between the base material 11 made of metal and the sealing member 30 formed of resin, and thus reduction of the airtightness between the sealing member 30 and the base material 11 accompanied with temperature change can be restrained.

The manufacturing method of the terminal-equipped case member 1 in the present example includes the preparation step S1 of preparing the base material 11 having the through hole 12, the terminal adhesion layer formation step S2 of forming the terminal adhesion layer 40 on the external terminal 20, and a sealing step S4 of sealing the gap 13 by filling the gap 13 between the external terminal 20 in the through hole 12 and the base material 11 with the sealing member 30 in a state that the external terminal 20 is inserted into the through hole 12, so that the sealing member 30 and the external terminal 20 are bonded to each other through the terminal adhesion layer 40. According to such a manufacturing method, the terminal-equipped case member 1 that is excellent in airtightness as described above can be manufactured.

Furthermore, in the present example, in the terminal adhesion layer formation step S2, the terminal adhesion layer 40 is formed on the external terminal 20 by electrodeposition. Accordingly, the terminal adhesion layer 40 can be formed as a firm thin film by electrodeposition, which makes heat deterioration hardly occur, so that the terminal-equipped case member 1 that is excellent in airtightness can be manufactured. Furthermore, in electrodeposition, because the throwing power of a molding material for the terminal adhesion layer 40 is satisfactory, occurrence of holiday in the area intended to form a terminal adhesion layer 40 can be prevented, and dropping of the molding material hardly occurs, so that a uniform coating can be formed. As a result, control of forming the terminal adhesion layer 40 becomes easy.

Furthermore, in the present example, in the sealing step S4, the sealing member 30 is formed by filling the gap between the external terminal 20 in the through hole 12 and the base material 11 with the first resin material of an engineering plastic or a super engineering plastic by insert molding. Further, in the present example, because the terminal adhesion layer 40 has been formed as a firm thin film by electrodeposition to hardly suffer heat deterioration, the sealing member 30 can be formed by filling the gap 13 with the first resin material of an engineering plastic or a super engineering plastic by insert molding as described above. As a result, the sealing member 30 can surely seal the gap 13, so that the terminal-equipped case member 1, which is further excellent in airtightness, can be manufactured.

Furthermore, in the present example, in the terminal adhesion layer formation step S2, the second resin material of a thermosetting epoxy resin is applied to the external terminal 20 by electrodeposition, and is dried in a temperature environment below the curing temperature of the second resin material to thereby form the terminal adhesion layer 40 in a semi-cured state. And in the sealing step S4, the external terminal 20 is inserted into the through hole 12 so that the terminal adhesion layer 40 is located inside the through hole 12, the first resin material of an engineering plastic is heat-melted and filled into the gap 13 to cause compatibilization with part of the second resin material, and the resin materials thus compatibilized are heated to the curing temperature of the second resin material or more to thereby completely cure the terminal adhesion layer 40. As a result, the terminal adhesion layer 40 and the sealing member 30 can be made into a state of being firmly stuck together, and thus, the airtightness between the sealing member 30 and the external terminal 20 can be further improved. In addition, between the terminal adhesion layer 40 and the sealing member 30, the terminal side compatible layer 45 in which both resin materials are compatible with each other is formed. The terminal side compatible layer 45 makes it possible to reduce a stress caused by thermal expansion and contraction difference between the external terminal 20 made of metal and the sealing member 30 formed of resin, and thus reduction of the airtightness between the sealing member 30 and the external terminal 20 accompanied with temperature change can be restrained.

Figure 6:
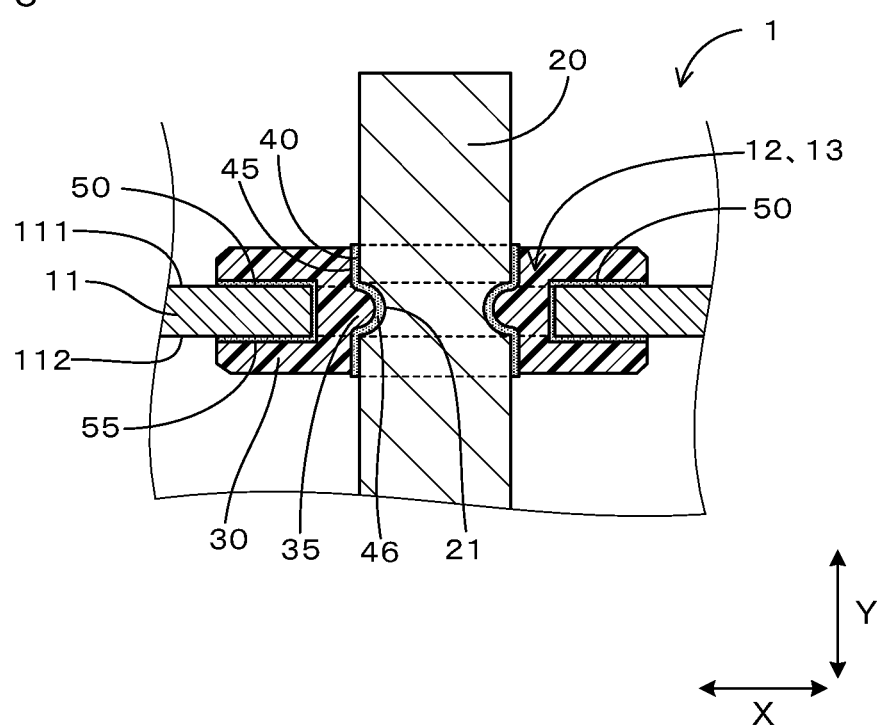
FIG. 6 is an enlarged cross-sectional view of the neighborhood of an external terminal, according to Modification 1.
Figure 8:
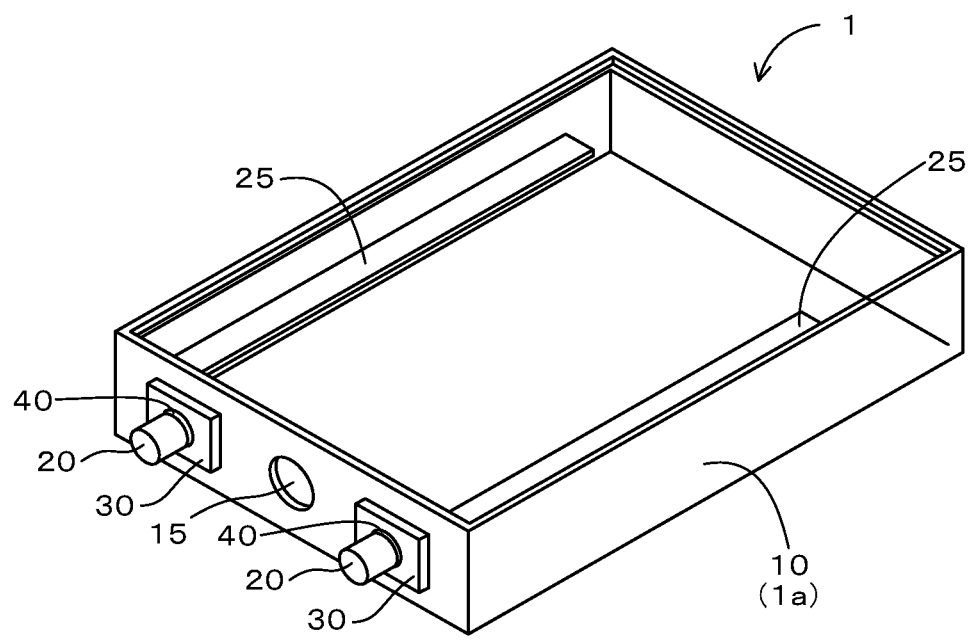
FIG. 8 is a perspective view of a terminal-equipped case member, according to Modification 3.

It is noted that a configuration in which differently from the external terminal 20 of the present example, the external terminal 20 has a recess 21 formed on an outer peripheral surface thereof, a part 46 of the terminal adhesion layer 40 penetrates the recess 21, and a part 35 of the sealing member 30 is bonded to the part 46 of the terminal adhesion layer 40 that has penetrated the recess 21 as in Modification 1 shown in FIG. 6, may be adopted. According to Modification 1, the adhesion between the terminal adhesion layer 40 and the external terminal 20 can be increased to thereby further increase the airtightness between the sealing member 30 and the external terminal 20.

Furthermore, it is noted that a configuration such that differently from the external terminal 20 of the present example, the external terminal 20 has a terminal through hole 22 formed therethrough, the part 46 of the terminal adhesion layer 40 penetrates the terminal through hole 22, and the part 35 of the sealing member 30 is bonded to the part 46 of the terminal adhesion layer 40 that has penetrated the terminal through hole 22, may be also adopted as shown in Modification 2 in FIG. 7(*a*) and FIG. 7(*b*). According also to Modification 2, the adhesion between the terminal adhesion layer 40 and the external terminal 20 can be increased, and the adhesion between the terminal adhesion layer 40 and the sealing member 30, so that the airtightness between the sealing member 30 and the external terminal 20 is further increased.

It is noted that in the present example, the case lid 1*b* is used as the case member 10, and the external terminal 20 is provided to the case lid 1*b*, however, the case body 1*a* may be used as the case member 10 in place of the case lid 1*b*, and the external terminal 20 is provided to the case body 1*a*. In addition, in Modification 3, the case body 1*a* is of a flat box shape with an opening on the longitudinal surface side. And the external terminal 20 is provided on the side wall adjacent to the opening. It is noted that the opening is configured to be sealable by being covered with the case lid that is not illustrated. Also in Modification 3, the same operational effects as those in Working Example 1 are exhibited.

As described above, according to the present example, the terminal-equipped case member 1, which is excellent in airtightness, can be provided.

(Comparative Tests)

Next, the following airtightness test was performed as Comparative Test 1.

Figure 9:
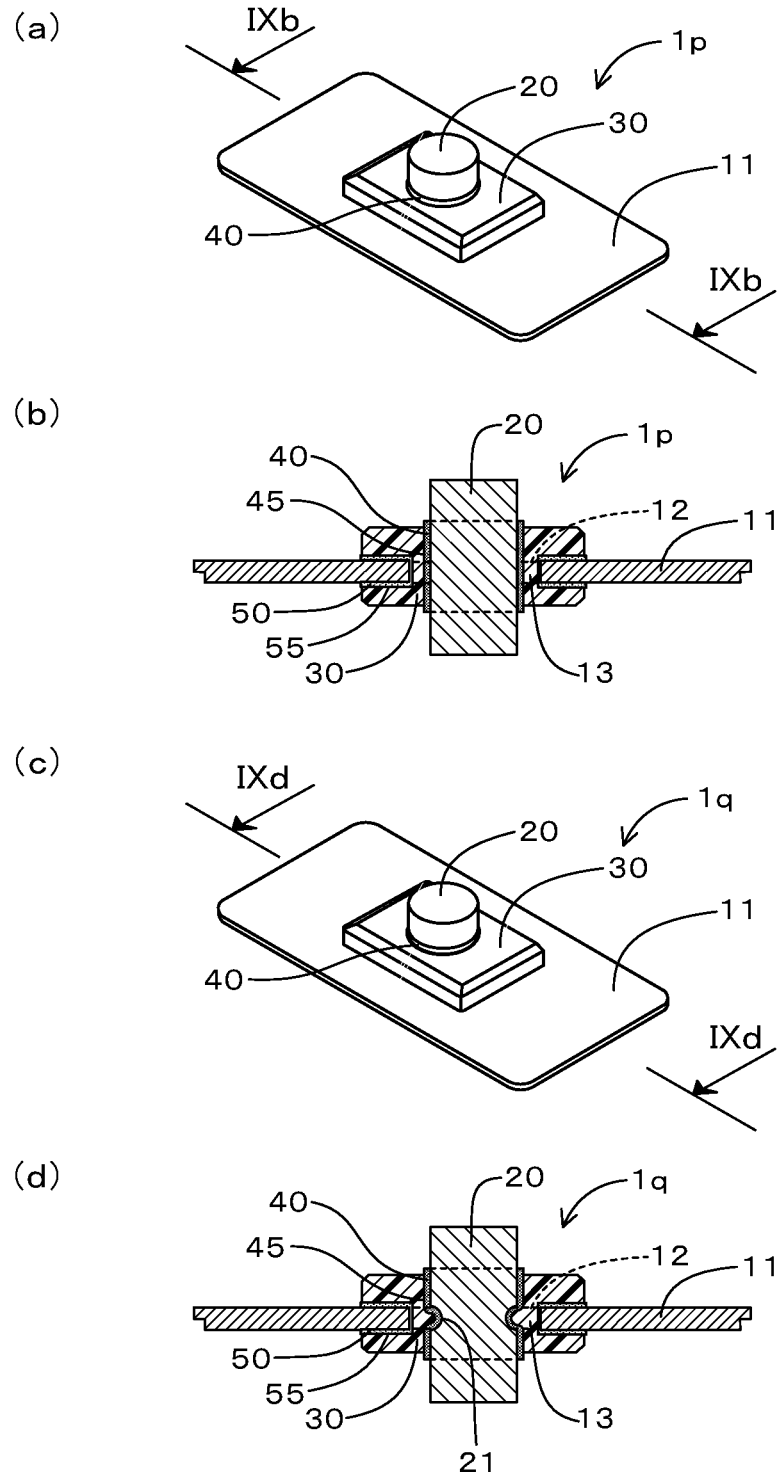
FIG. 9 shows perspective and cross-sectional views showing configurations of Test Examples 1 and 2 in Comparative Tests 1 and 2, respectively.

First, in preparation for Test Example 1, a specimen 1*p* including the base material 11, the external terminal 20, the sealing member 30, the terminal adhesion layer 40, and the base material adhesion layer 50, which are the same configurations as those of the terminal-equipped case member 1 of Working Example 1 was prepared as shown in FIG. 9(*a*), and FIG. 9(*b*) that is a cross-section taken along IXb-IXb line of FIG. 9(*a*). It is noted that the specimen 1*p* is provided with only one external terminal 20, and is not provided with the safety valve 15.

Further, in preparation for Test Example 2, a specimen 1*q* including the base material 11, the external terminal 20, the sealing member 30, the terminal adhesion layer 40, and the base material adhesion layer 50, which are the same configurations as those of the terminal-equipped case member 1 of Modification 1 was prepared as shown in FIG. 9(*c*), and FIG. 9(*d*) that is a cross-section taken along IXd-IXd line of FIG. 9(*c*). It is also noted that the specimen 1*q* was provided with only one external terminal 20, and was not provided with the safety valve 15.

Figure 10:
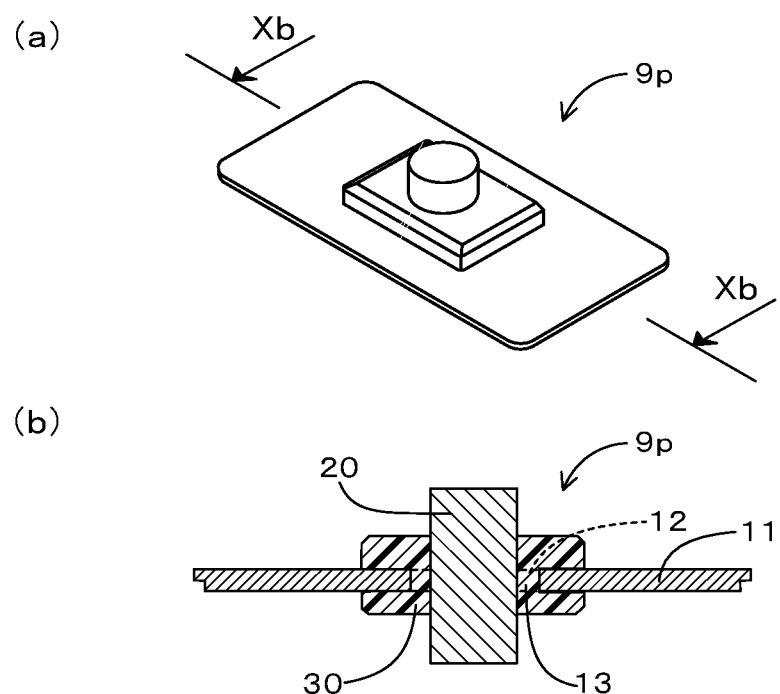
FIG. 10 shows perspective and cross-sectional views showing a configuration of Comparative Example in Comparative Tests 1 and 2.

Furthermore, in preparation for Comparative Example, a specimen 9*p* configured not to include the terminal adhesion layer 40 and the base material adhesion layer 50 in the above-mentioned specimen 1*p* was prepared as shown in FIG. 10(*a*), and FIG. 10(*b*) that is a cross-section taken along Xb-Xb line of FIG. 10(*a*).

As an airtightness test for Comparative Test 1, Helium Leak Test was adopted and performed in the following manner. First, each specimen 1*p*, 1*q*, and 9*p* in Test Examples 1 and 2, and Comparative Example 1 respectively was set in a prescribed jig for helium leak test, and then each leakage amount of helium was measured by an inner vacuum method (a spraying method) using a helium leakage detector (manufactured by ULVAC, Inc., Model number: HELIOT 904). It is noted that the acceptance criterion was set to $1.0 \times 10^{-7}$ Pa·m$^3$/sec or less.

Next, as Comparative Test 2, a below-mentioned tensile strength test was performed. Test Examples 1 and 2, and Comparative Example 1 were set in the same way as in Comparative Test 1. In the tensile strength test for Comparative Test 2, the external terminal 20 and the base material 11 of each specimen 1*p*, 1*q*, and 9*p* in Test Examples 1 and 2, and Comparative Example 1 respectively were chucked and pulled in the axial direction Y of the external terminal 20 at a tensile rate of 25.4 mm/min until the specimen was broken, and the peak load was measured using an electric tensile-testing machine (manufactured by YONEKURA MFG Co., Ltd., Model number: CATY-1005Z).

Test results of the above-mentioned Comparative Tests 1 and 2 are listed in Table 1. (Table 1)

TABLE 1

| | Test Example 1 | Test Example 2 | Comparative Example |
|---|---|---|---|
| Comparative Test 1 (Helium Leak Test) [Pa · m$^3$/sec] | $2.4 \times 10^{-9}$ | $2.6 \times 10^{-9}$ | $1.6 \times 10^{-6}$ |
| Comparative Test 2 (Tensile Strength Test) [MPa] | 1.5 | 8.8 | 1.6 |

As shown in Table 1, it was confirmed that in Comparative Test 1, the He leakage amounts in Test Examples 1 and 2 are significantly smaller than that in Comparative Example. And it was confirmed that in Comparative Test 2, Test Example 1 has a tensile strength equivalent to that of Comparative Example, and Test Example 2 has a tensile strength significantly larger than that of Comparative Example.

The present invention is not limited to the above-mentioned working example and modifications, and can be applied to various working examples within the range that does not depart from the gist of the present invention.

The invention claimed is:

1. A terminal-equipped case member having an external terminal for electrically connecting an external device, which is fixed to a case body for housing an electronic component or a case member constituting a case lid that is attached to the case body, the terminal-equipped case member comprising:
   a base material made of metal that forms the case member;
   the external terminal made of metal that is inserted into a through hole formed through the base material; and
   a sealing member formed of a first resin material that seals a gap between the external terminal in the through hole and the base material, wherein
   the external terminal and the sealing member are bonded to each other through a terminal adhesion layer formed of a second resin material with a higher adhesion to the external terminal than that of the first resin material,
   the first resin material is an engineering plastic other than polypropylene or a super engineering plastic, and
   the second resin material is an epoxy resin, a polyamide-imide resin, or a polyimide resin.

2. The terminal-equipped case member according to claim 1, wherein the terminal adhesion layer is composed of an electrodeposition coating film.

3. The terminal-equipped case member according to claim 1, wherein a thickness of the terminal adhesion layer is within a range of 10-80 μm.

4. The terminal-equipped case member according to claim 3, wherein the external terminal has a recess or a through hole formed on an outer peripheral surface thereof, part of the terminal adhesion layer penetrates the recess or the through hole, and part of the sealing member is bonded to the part of the terminal adhesion layer that has penetrated the recess or the through hole.

5. The terminal-equipped case member according to claim 4, wherein the base material and the sealing member are bonded to each other through a base material adhesion layer formed of a third resin material with a higher adhesion to the external terminal than that of the first resin material.

6. The terminal-equipped case member according to claim 3, wherein the base material and the sealing member are bonded to each other through a base material adhesion layer formed of a third resin material with a higher adhesion to the external terminal than that of the first resin material.

7. The terminal-equipped case member according to claim 2, wherein the external terminal has a recess or a through hole formed on an outer peripheral surface thereof, part of the terminal adhesion layer penetrates the recess or the through hole, and part of the sealing member is bonded to the part of the terminal adhesion layer that has penetrated the recess or the through hole.

8. The terminal-equipped case member according to claim 7, wherein the base material and the sealing member are bonded to each other through a base material adhesion layer formed of a third resin material with a higher adhesion to the external terminal than that of the first resin material.

9. The terminal-equipped case member according to claim 2, wherein the base material and the sealing member are bonded to each other through a base material adhesion layer formed of a third resin material with a higher adhesion to the external terminal than that of the first resin material.

10. The terminal-equipped case member according to claim 1, wherein a thickness of the terminal adhesion layer is within a range of 10-80 μm.

11. The terminal-equipped case member according to claim 10, wherein the external terminal has a recess or a through hole formed on an outer peripheral surface thereof, part of the terminal adhesion layer penetrates the recess or the through hole, and part of the sealing member is bonded to the part of the terminal adhesion layer that has penetrated the recess or the through hole.

12. The terminal-equipped case member according to claim 11, wherein the base material and the sealing member are bonded to each other through a base material adhesion layer formed of a third resin material with a higher adhesion to the external terminal than that of the first resin material.

13. The terminal-equipped case member according to claim 10, wherein the base material and the sealing member are bonded to each other through a base material adhesion layer formed of a third resin material with a higher adhesion to the external terminal than that of the first resin material.

14. The terminal-equipped case member according to claim 1, wherein the external terminal has a recess or a through hole formed on an outer peripheral surface thereof, part of the terminal adhesion layer penetrates the recess or the through hole, and part of the sealing member is bonded to the part of the terminal adhesion layer that has penetrated the recess or the through hole.

15. The terminal-equipped case member according to claim 14, wherein the base material and the sealing member are bonded to each other through a base material adhesion layer formed of a third resin material with a higher adhesion to the external terminal than that of the first resin material.

16. The terminal-equipped case member according to claim 1, wherein the base material and the sealing member are bonded to each other through a base material adhesion layer formed of a third resin material with a higher adhesion to the external terminal than that of the first resin material.

17. A method for manufacturing the terminal-equipped case member according to claim 1, the method comprising:
   a preparation step of preparing the base material having the through hole;
   a terminal adhesion layer formation step of forming the terminal adhesion layer on the external terminal; and
   a sealing step of sealing the gap by filling the gap between the external terminal in the through hole and the base material with the first resin material in a state that the external terminal is inserted into the through hole to form the sealing member so that the external terminal and the sealing member are bonded to each other through the terminal adhesion layer.

18. The method for manufacturing the terminal-equipped case member according to claim 17, wherein in the terminal adhesion layer formation step, the terminal adhesion layer is formed on the external terminal by electrodeposition.

19. The method for manufacturing the terminal-equipped case member according to claim 18, wherein in the sealing step, the sealing member is formed by filling the gap between the external terminal in the through hole and the base material with the first resin material of an engineering plastic or a super engineering plastic by insert molding.

20. The method for manufacturing the terminal-equipped case member according to claim 18, wherein in the terminal adhesion layer formation step, the second resin material of a thermosetting epoxy resin, a polyamide-imide resin, or a polyimide resin is applied to the external terminal by electrodeposition, and is dried in a temperature environment below the curing temperature of the second resin material to thereby form the terminal adhesion layer in a semi-cured state, and in the sealing step, the external terminal is inserted into the through hole to be located inside the through hole, the first resin material of an engineering plastic or a super engineering plastic is heat-melted and filled into the gap to cause compatibilization with part of the second resin material, and the resin materials thus compatibilized are heated to the curing temperature of the second resin material or more to thereby completely cure the terminal adhesion layer.

21. The terminal-equipped case member according to claim 1, wherein the engineering plastic is at least one selected from the group consisting of a nylon resin and a polycarbonate resin and the super engineering plastic is at least one selected from the group consisting of a polyphenylene sulfide resin, a polysulfone resin, a polyether sulphone resin and a polyamide-imide resin.

* * * * *